United States Patent
Yee et al.

(10) Patent No.: US 10,479,677 B2
(45) Date of Patent: Nov. 19, 2019

(54) FLEXIBLE DISPOSABLE MEMS PRESSURE SENSOR

(71) Applicants: Robert Bosch GmbH, Stuttgart (DE); Seow Yuen Yee, Mountain View, CA (US); Gary Yama, Mountain View, CA (US)

(72) Inventors: Seow Yuen Yee, Mountain View, CA (US); Gary Yama, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 155 days.

(21) Appl. No.: 15/535,327

(22) PCT Filed: Dec. 10, 2015

(86) PCT No.: PCT/US2015/065084
§ 371 (c)(1),
(2) Date: Jun. 12, 2017

(87) PCT Pub. No.: WO2016/100096
PCT Pub. Date: Jun. 23, 2016

(65) Prior Publication Data
US 2017/0362083 A1    Dec. 21, 2017

Related U.S. Application Data

(60) Provisional application No. 62/091,683, filed on Dec. 15, 2014.

(51) Int. Cl.
*B81C 99/00* (2010.01)
*G01L 9/00* (2006.01)
(Continued)

(52) U.S. Cl.
CPC .......... *B81C 99/008* (2013.01); *B81B 7/0058* (2013.01); *G01L 9/0005* (2013.01);
(Continued)

(58) Field of Classification Search
CPC ............ B81C 99/008; B81C 2201/056; B81C 2201/038; B81C 2201/0264;
(Continued)

(56) References Cited

U.S. PATENT DOCUMENTS

| 4,572,000 A | 2/1986 | Kooiman |
| 6,558,477 B1 * | 5/2003 | Scovell ............... B08B 3/10 |
| | | 134/25.4 |

(Continued)

FOREIGN PATENT DOCUMENTS

| CN | 101471203 A | 7/2009 |
| CN | 103720463 A | 4/2014 |

(Continued)

OTHER PUBLICATIONS

International Search Report corresponding to PCT Application No. PCT/US2015/065084, dated Feb. 24, 2016 (4 pages).
(Continued)

*Primary Examiner* — Nathaniel T Woodward
(74) *Attorney, Agent, or Firm* — Maginot Moore & Beck LLP

(57) ABSTRACT

A MEMS device, e.g., a flexible MEMS pressure sensor, is formed by disposing a sacrificial layer, such as photoresist, on a substrate. A first flexible support layer is disposed on the substrate, and a first conductive layer is disposed over a portion of the first support layer. A liquid or gel separator, e.g., silicone oil, is disposed on an internal region of the first conductive layer. A second flexible support layer encapsulates the first conductive layer and the separator. A second conductive layer disposed over the second support layer at least partially overlaps the first conductive layer and forms a parallel plate capacitor. A third flexible support layer encapsulates the second conductive layer and second support layer. Soaking the sensor in hot water releases the sensor from the sacrificial layer.

13 Claims, 4 Drawing Sheets

(51) Int. Cl.
  *B81B 7/00* (2006.01)
  *G01L 19/14* (2006.01)
(52) U.S. Cl.
  CPC .......... *G01L 19/144* (2013.01); *G01L 19/147*
    (2013.01); *B81B 2201/0264* (2013.01); *B81C*
    *2201/038* (2013.01); *B81C 2201/056* (2013.01)
(58) Field of Classification Search
  CPC . G01L 19/147; G01L 19/144; G01L 19/0005;
    B81B 7/0058; B81B 7/02
  USPC .......................................................... 73/754
  See application file for complete search history.

(56) References Cited

U.S. PATENT DOCUMENTS 8,590,387 B2  11/2013  Crivelli
8,874,182 B2  10/2014  Etzkorn et al.
2006/0278007 A1  12/2006  Harasyn et al.
2009/0299216 A1  12/2009  Chen et al.

FOREIGN PATENT DOCUMENTS

| | | | |
|---|---|---|---|
| CN | 103743503 A | 4/2014 | |
| EP | 2860744 A1 | 4/2015 | |
| JP | H11-258095 A | 9/1999 | |
| WO | 2013056130 A1 | 4/2013 | |
| WO | WO-2013056130 A1 * | 4/2013 | ............... A61B 3/16 |
| WO | 2013187397 A1 | 12/2013 | |
| WO | WO-2013187397 A1 * | 12/2013 | ........... H03K 17/975 |

OTHER PUBLICATIONS

Supplementary European Search Report corresponding to European Patent Application No. 15 87 0748 (13 pages).
English Translation of Chinese First Office Action corresponding to Chinese Patent Application No. 201580076079.9 (14 pages).

\* cited by examiner

FLEXIBLE DISPOSABLE MEMS PRESSURE SENSOR

RELATED APPLICATION

This Application is a 35 U.S.C. § 371 National Stage Application of PCT/US2015/065084, filed on Dec. 10, 2015, which claims priority to U.S. Provisional Application No. 62/091,683 filed on Dec. 15, 2014, entitled "FLEXIBLE DISPOSABLE MEMS PRESSURE SENSOR". The disclosures of the above-identified patent applications are both incorporated by reference herein in their entirety.

TECHNICAL FIELD

This disclosure relates generally to semiconductor devices and, more particularly, to a capacitive microelectromechanical system (MEMS) pressure sensor.

BACKGROUND

MEMS have proven to be effective solutions in various applications due to the sensitivity, spatial and temporal resolutions, and lower power requirements exhibited by MEMS devices. Consequently, MEMS-based sensors, such as accelerometers, gyroscopes, acoustic sensors, optical sensors, and pressure sensors, have been developed for use in a wide variety of applications.

In general, capacitive MEMS pressure sensors include a first electrode that forms one plate of a parallel plate capacitor and a second electrode that forms the other plate of the parallel plate capacitor. The first electrode is generally fixed and is typically provided in a substrate, such as a silicon wafer. The second electrode is generally movable and is incorporated into a deformable membrane that is suspended over the first electrode on the surface of the substrate. The first and second electrodes are generally spaced apart by open space, a dielectric, or another material. The deformable membrane is configured to deflect toward the substrate under an applied pressure which alters the gap between the fixed electrode and the movable electrode, resulting in a change in the capacitance between the two electrodes. By monitoring the change in capacitance between the fixed electrode and the movable electrode, a magnitude of a pressure applied to the deformable membrane can be determined.

The electrodes may be formed in a variety of different ways, such as by the deposition of a conductive film, electrical isolation of a conductive layer, and adding a spacer layer between two conductive layers. Surface micromachining is used to fabricate many MEMS devices. With surface micromachining, a MEMS device structure can be built on a silicon substrate using processes such as chemical vapor deposition. These processes allow MEMS structures to include layer thicknesses of less than a few microns with substantially larger in-plane dimensions. Frequently, these devices include parts, such as capacitive electrodes, which are configured to move with respect to other parts of the device. In this type of device, the movable structure is frequently built upon a sacrificial layer of material. After the movable structure is formed, the movable structure can be released by selective wet or dry etching of the sacrificial layers. After wet etching, the released MEMS device structure can be rinsed in deionized water to remove the etchant and etch products. For dry release, no subsequent cleaning may be necessary.

In some cases, MEMS having moving or flexing components have a limited lifespan, especially when such devices are released from the substrate and cannot benefit from added support of the substrate. In an example, MEMS devices being used on or near biological material or in a harsh environment may need to be regularly replaced to maintain accurate operation. Customary MEMS devices such as pressure sensors often require significant packaging, as well as expensive materials and processing requirements, and are thus not optimized for the uses described above. What is needed, therefore, is a flexible MEMS device that can be produced easily and at scale so as to be disposable.

SUMMARY

The following is a brief summary of subject matter described in greater detail herein. This summary is not intended to be limiting as to the scope of this disclosure or to the claims.

In order to facilitate accurate sensing of at least one variable, such as pressure, a MEMS device is configured so as to be flexible. The MEMS device includes a MEMS sensor element that has at least one conducting layer that extends to a side of the MEMS device and is configured to operatively connect the MEMS device to an apparatus. The MEMS sensor element consists of flexible materials, such that the MEMS sensor element is fully flexible.

In an embodiment, the MEMS sensor element is a MEMS pressure sensor that includes at least one parallel plate capacitor.

In one embodiment, the MEMS sensor element includes first, second, and third flexible support layers, and first and second conductive layers. The first conducting layer forms a first electrode of the parallel plate capacitor, and is disposed on the first flexible support layer so as to extend from a first side of the MEMS sensor element over less than an entirety of the MEMS sensor element toward a second side opposite the first side. The second flexible support layer is disposed over the first flexible support layer and the first conducting layer, such that the first conducting layer is encapsulated by the first flexible support layer and the second flexible support layer. The second conducting layer forms a second electrode of the parallel plate capacitor, and is disposed on the second flexible support layer, and extends from the second side of the MEMS sensor element over less than an entirety of the MEMS sensor element toward the first side, such that the second conducting layer at least partially overlaps the first conducting layer. The first and second conducting layers together form the parallel plate capacitor. The third flexible support layer is disposed over the second conducting layer and the second flexible support layer such that the second conducting layer is encapsulated between the second flexible support layer and the third flexible support layer.

In another embodiment, the MEMS sensor element further includes a separator encapsulated between the first conducting layer and the second flexible support layer, and configured to space apart the first conductor layer from the second conductor layer.

In a further embodiment, the separator is one of a liquid or a gel, and has a lower vaper pressure than a deposition pressure of the second flexible support layer. In one embodiment, the second flexible support layer includes a Parylene, and the separator includes a silicone oil.

In an embodiment, the MEMS sensor element further includes at least one of a connecting element that extends from the first conducting layer to the second side of the MEMS sensor element, and a connecting element that extends from the second conducting layer to the first side of the MEMS sensor element.

In another embodiment, the MEMS device further includes at least one apparatus body mount. The apparatus body mount includes at least one electrical component that is configured to removably receive the MEMS sensor element, and that is configured to electrically connect to the MEMS sensor element when the MEMS sensor element is received in the at least one apparatus body mount. In one embodiment, the MEMS sensor element is configured as a disposable sensor, and the at least one apparatus body mount is a reusable mount that includes electrical components for operating the MEMS sensor element. In an embodiment, the MEMS device is a wrist band that includes two apparatus body mounts connected via a band, and a MEMS sensor element received between the two mounts to close the band.

In another embodiment, the at least one apparatus body mount further includes a pair of mounting members. The mounting members are configured to receive the MEMS sensor element therebetween with one of an interference fit, a snap fit, or any other acceptable type of removable fit. In an embodiment, at least one of the mounting members is a spring member that is pivotably mounted on the at least one apparatus body mount, and that is configured to clip the MEMS sensor element into the at least one apparatus body mount along with an opposite mounting member.

In an exemplary embodiment, a method of producing a MEMS device includes disposing a layer of photoresist on a substrate, forming a MEMS sensor element over the layer of photoresist to form an intermediate structure, and soaking the intermediate structure in a water bath having a temperature from about 30 degrees C. to about 90 degrees C. until the MEMS sensor element is released from the layer of photoresist. In an embodiment, the MEMS sensor element is at least one of encapsulated by material that is insoluble to water and configured so as to be unreactive to water.

In another exemplary embodiment, a method of producing a flexible MEMS pressure sensor includes forming a sacrificial layer on a substrate, forming a first flexible support layer on the substrate, forming a first conductive layer on the first flexible layer that extends from a first side over less than an entirety of the first flexible support layer, forming a liquid or gel separator on an internal region of the first conductive layer, forming a liquid or gel separator on an internal region of the first conductive layer, forming a second flexible support layer via vapor deposition on the first flexible support layer, on the separator, and on the first conducting layer, extending from the first side to a second side opposite the first side, so as to encapsulate the separator between the first conductive layer and the second flexible support layer, and so as to encapsulate the first conductive layer between the first flexible support layer and the second flexible support layer and separator, wherein the separator has a lower vapor pressure than a vapor pressure that occurs during the vapor deposition of the second flexible support layer, forming a second conductive layer on the second flexible support layer from the second side over less than an entirety of the second flexible support layer, such that the second conductive layer at least partially overlaps the first conductive layer to form a parallel plate capacitor, and forming a third flexible support layer over the second conductive layer and the second flexible support layer so as to encapsulate the second conductive layer between the second flexible support layer and the third flexible support layer.

In an embodiment, the method of producing a MEMS pressure sensor further includes soaking the MEMS pressure sensor in a water bath having a temperature of about 30 degrees C. to about 90 degrees C. until the MEMS pressure sensor is released from the sacrificial layer.

DETAILED DESCRIPTION

For the purposes of promoting an understanding of the principles of the embodiments described herein, reference is now made to the drawings and descriptions in the following written specification. No limitation to the scope of the subject matter is intended by the references. This disclosure also includes any alterations and modifications to the illustrated embodiments and includes further applications of the principles of the described embodiments as would normally occur to one skilled in the art to which this document pertains.

Figure 1:
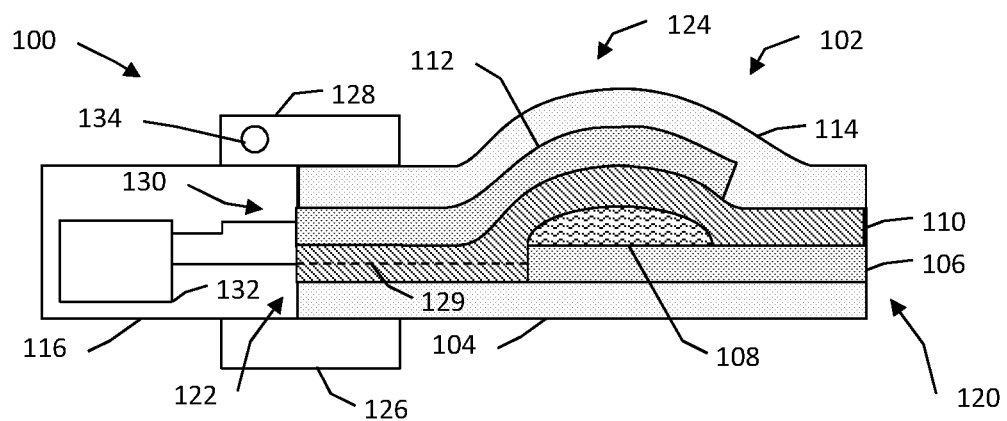
FIGS. 1 and 2 are side cross section views of different exemplary embodiments of MEMS pressure sensors mounted in apparatus bodies according to the disclosure.

FIG. 1 illustrates an exemplary embodiment of an apparatus 100 that includes a disposable flexible MEMS device, which in this embodiment is a capacitive MEMS pressure sensor 102. The pressure sensor 102 includes a first flexible support layer 104, a first conducting layer 106, a separator 108, a second flexible support layer 110, a second conducting layer 112, and a third flexible support layer 114. In this embodiment, the pressure sensor 102 is mounted within a first apparatus body mount 116.

The first conducting layer 106 is positioned between the first flexible support layer 104 and the separator 108, and forms a first electrode of a parallel plate capacitor. The second flexible support layer 110 covers the first conducting layer 106 and the separator 108 such that the separator 108 is between the first conducting layer 106 and the second flexible support layer 110, and such that the first conducting layer 106 and the separator 108 are between the first flexible support layer 104 and the second flexible support layer 110.

The first conducting layer 106 extends from a first side 120 of the pressure sensor 102 over less than an entirety of the first flexible support layer 104 such that a portion of the second flexible support layer 110 is in contact with the first flexible support layer 104 so as to encapsulate the first conducting layer 106. The separator 108 extends over at least an interior portion of the first conducting layer 106 such that the second flexible support layer 110 and the first conducting layer 106 encapsulate the separator 108.

The second conducting layer 112 extends from a second side 122 of the pressure sensor 102, opposite the first side 120, over less than an entirety of the second flexible support layer 110 such that at least a portion of the first conducting layer 106 and the second conducting layer 112 overlap to form a parallel plate capacitor 124 separated via the separator 108. The second conducting layer 112 forms a second electrode of a parallel plate capacitor. Advantageously, neither the first nor second electrode is fixed on a support surface. Because both the first and second conducting layers 106, 112 are free to move, for example, due to a change in ambient pressure around the apparatus 100, the pressure sensor 102 exhibits increased sensitivity relative to conventional capacitive MEMS pressure sensors, and is fully flexible, unlike a sensor mounted on a rigid support surface.

The third flexible support layer 114 covers the second conducting layer 112 and a portion of the second flexible support layer 110 not in contact with the second conducting layer 112 such that the first conducting layer 106, separator 108, second flexible support layer 110, and second conducting layer 112 are between and encapsulated by the first flexible support layer 104 and the third flexible support layer 114.

The first, second, and third flexible support layers 104, 110, 114 includes a flexible polymer, which in this embodiment is a thin-film coating of Parylene. In other embodiments other flexible materials are included. In one embodiment, a non-polymer flexible material is used. As used herein, "Parylene" means a polymerization of para-xylylene (poly(p-xylylene)) or its substituted derivatives. In different embodiments, a deposited Parylene is passive or reactive. In at least one embodiment, a deposited Parylene is halogenated, such as with Fluorine, Chlorine, or Bromine. In some embodiments, the Parylene is a Parylene variant such as Parylene HT, Parylene A, Parylene AM, Parylene AF-4, Parylene N, Parylene C, Parylene D, or Parylene X polymers. In one embodiment, the first, second, and third flexible support layers 104, 110, 114 include the same materials. In another embodiment, the first, second, and third flexible support layers 104, 110, 114 include different materials.

The first and second conducting layers 106, 112 include a conductive material such as a metal, metal oxide, or other materials suitable to form the electrodes of the parallel plate capacitor. Advantageously, the separator 108 is a gel or liquid that has a lower vapor pressure than a vapor pressure that occurs during vapor deposition of materials included in the second flexible support layer 110, and that is configured to operate as an insulator or dielectric between the electrodes of a parallel plate capacitor. In this embodiment, where the second flexible support layer 110 includes Parylene, the separator 108 includes a silicone oil. As used herein, "silicone oil" means any liquid polymerized siloxane with organic side chains, such as polydimethylsiloxane.

The first apparatus body mount 116 includes a first mounting member 126, a second mounting member 128, a contact region 130, and at least one electrical component 132. The first mounting member 126 is configured to engage with the first flexible support layer 104, and the second mounting member 128 is configured to engage with the third flexible support layer 114 such that the second side 122 of the pressure sensor 102 is mounted between the first and second mounting members 126, 128. In this embodiment, the first and second mounting members 126, 128 are spaced apart from each other such that the first and second mounting members 126, 128 are configured to mount the pressure sensor 102 with an interference fit therebetween.

The contact region 130 is configured to contact at least one of the first and second conducting layers 106, 112. For example, in another embodiment (not shown) the first apparatus body support 116 is mounted on the first side 120 of the pressure sensor 102. In this embodiment, the contact region is configured to contact the second conducting layer 112.

A connecting element 129 is configured to provide an electronic connection from the first conducting layer 106 through the second flexible support layer 110. In this embodiment, the connecting element 129 is a wire of conductive material that extends from the first conductive layer 106 across the entirety of the first flexible support layer 104, and is covered or encapsulated by the second flexible support layer 110. Although illustrated as passing through the second flexible support layer 110 in FIG. 1, the connecting element can also be disposed between the first flexible support layer 104 and the second flexible support layer 110.

The at least one electrical component 132 is electrically connected to the contact region 130 and is configured to receive an electrical signal from the contact region 130 generated due to the contact with the at least one of the first and second conducting layers 106, 110. The at least one electrical component 132 can include, for example, a power component, a communication component, and an integrated circuit and/or processor. The power component can include a battery or a power connection. The communication component can include, for example, a wireless antenna and transmitter or a wired connection. The processor and/or integrated circuit can be configured to, for example, receive the electrical signal from the contact region 130, analyze the electrical signal, such as to determine a pressure sensed by the pressure sensor 102, and transmit an output signal to the communication component.

The first apparatus body mount 116 is configured as a clip, and the second mounting members 128 is a spring member configured to pivot about a base point 134 to enable clipping the pressure sensor 102 between the first and second mounting members 126, 128. In another embodiment, the first mounting member 126 is a spring member configured to pivot in order to clip the pressure sensor 102. In one embodiment, both mounting members 126, 128 are rigid members configured to mount the pressure sensor 102 therebetween with a snap fit.

Figure 2:
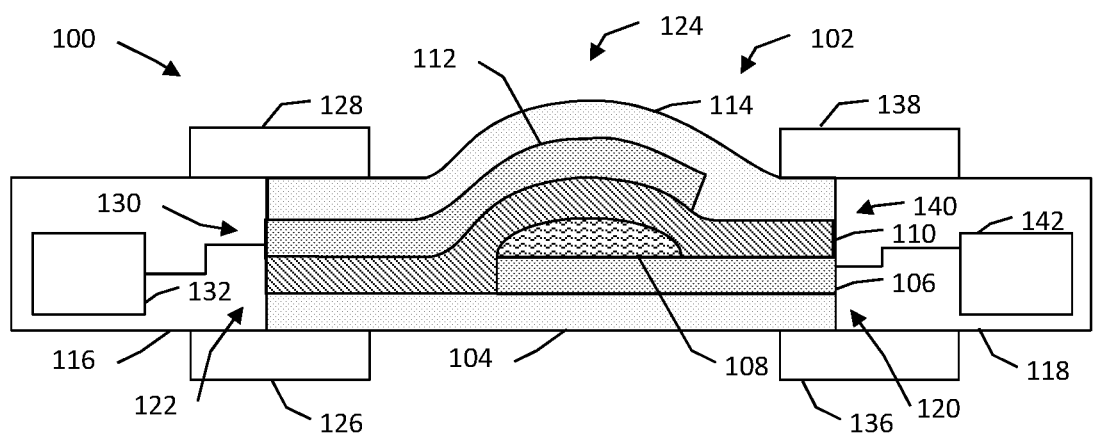

FIG. 2 illustrates another embodiment where the pressure sensor 102 is additionally mounted within a second apparatus body mount 118. The second apparatus body mount 118 includes a first mounting member 136, a second mounting member 138, a contact region 140, and at least one electrical component 142. The first mounting member 136 is configured to engage with the first flexible support layer 104, and the second mounting member 138 is configured to engage with the third flexible support layer 114 such that the first side 120 of the pressure sensor 102 is mounted between the first and second mounting members 136, 138. The first and second mounting members 136, 138 are spaced apart from each other such that the first and second mounting members 136, 138 are configured to mount the pressure sensor 102 with an interference fit therebetween.

The contact region 140 is configured to contact at least one of the first and second conducting layers 106, 110. In this embodiment, the contact region 130 of the first apparatus body mount 116 is connected to the second conducting layer 112, and the contact region 140 of the second apparatus body mount 118 is connected to the first conducting layer 106.

In another embodiment, a connecting element (not shown) is configured to provide an electronic connection from the second conducting layer 112 through the second flexible support layer 110 or third flexible support layer 114 to the contact region 140. In one embodiment, the connecting element is a wire of conductive material (not shown) that extends from the second conductive layer 112 across the entirety of the second flexible support layer 110, and is covered and encapsulated by the third flexible support layer 114. The at least one electrical component 142 can include electrical components similar to the components described above with regard to the electrical component 132 of the first apparatus body element 116.

In one embodiment, the first apparatus body element 116 is in communication with the second apparatus body element 118 to enable the at least one electrical component 132 or 142 to receive electrical signals generated from both contact regions 130, 140 in order to analyze a pressure acting on the pressure sensor. In one embodiment, the communication is wireless via a wireless communication antenna and transmitter. In another embodiment, the first and second apparatus body elements 116, 118 form a unified body and are connected via a wired connection. In one embodiment the first and second apparatus body elements 116, 118 are respective ends of a strap that is joined via mounting the pressure sensor 102 to the first and second apparatus body elements 116, 118, such as, for example, a wrist strap.

Other types of mounts are also contemplated. In one embodiment, a socket is configured to receive a side of the first flexible support layer 104 facing away from the pressure sensor 102 and includes sidewalls that are configured to receive and mount the pressure sensor 102 via a clip, snap, or interference fit.

Because the pressure sensor 102 is formed from flexible materials, the pressure sensor 102 is flexible, and can thus be utilized in cases when a rigid sensor or sensor mounted on a rigid support may not be optimal. Additionally, since the materials, and methods of production as described below, are relatively inexpensive and uncomplicated, the pressure sensor is well adapted for use as a disposable sensor. Advantageously, the pressure sensor 102 is removably mounted in the apparatus body mounts 116 and/or 118, such that the pressure sensor 102 can be disposed of and replaced. While the apparatus body mounts 116 and/or 118 include various electrical components that require assembly, the pressure sensor 102 is formed with low cost materials and is inexpensive to mass produce and replace. Further, capacitive MEMS pressure sensors like the pressure sensor 102 generally have a limited lifespan that is shorter than a potential life span of the apparatus body. The removable mounting of the pressure sensor 102 in the apparatus body mounts 116, 188 enables replacement of the inexpensive pressure sensor 102 without replacing the more costly apparatus.

Figure 3:
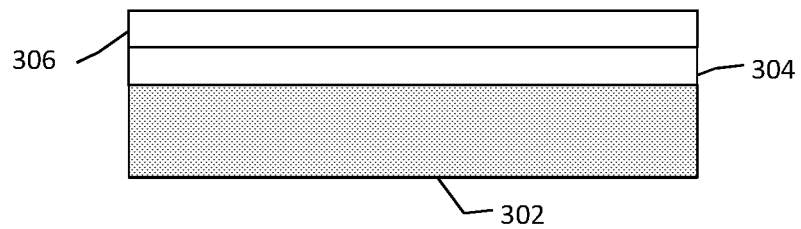
FIGS. 3-9 are side cross section views illustrating an exemplary method of producing a MEMS pressure sensor according to the disclosure.

FIGS. 3-9 illustrate a process for producing a MEMS device according to the disclosure. As shown in FIG. 3, a sacrificial layer 304 is applied to a substrate 302. The substrate 302 can be, for example, silicon, or other conventional substrate materials. The sacrificial layer 304 can include, for example a photoresist material, a water soluble material, or a material that is soluble or removable via other solvents such as Acetone, and can be applied by any conventional process such as chemical vapor deposition. A flexible material coating 306 is applied over the sacrificial layer 304 to form a first flexible support layer. As described above, the flexible material of the coating 306 can be a polymer such as Parylene.

Figure 4:
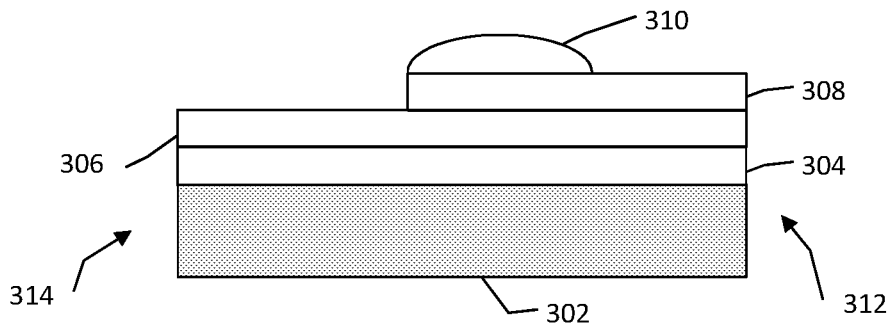

FIG. 4 illustrates a first conducting layer 308 applied over less than an entirety of the first flexible support layer 306 such that a portion of the first flexible support layer 306 extending from a first side 312 remains exposed. In one embodiment, the first conducting layer is applied by applying a layer of conductive material, and etching a portion of the layer of conducting material away such that a portion of the first flexible support layer 306 is exposed. In some embodiments, a wire connection or other type of connection configured to contact a contact region of an apparatus body mount is applied over the exposed portion of the first flexible support layer 306.

A separator 310, for example a silicone oil, is applied over an interior portion of the first conducting layer 308 such that a portion of the first conducting layer 308 extending from a second side 314 remains exposed. An "interior portion" means a portion between the first side 312 and a second side 314.

In some embodiments, it may be beneficial to localize the separator 310 to be within a defined portion of the surface of the first conducting layer 308. In one embodiment, a hydrophobicity control material is applied to at least one portion of the first conducting layer 308 in order to define a region of the first conducting layer 308 that attracts or repels the separator 310. The hydrophobicity control material can be, for example, a Parylene such as a Parylene treated with Oxygen plasma, or CYTOP, an amorphous fluoropolymer.

Figure 5:
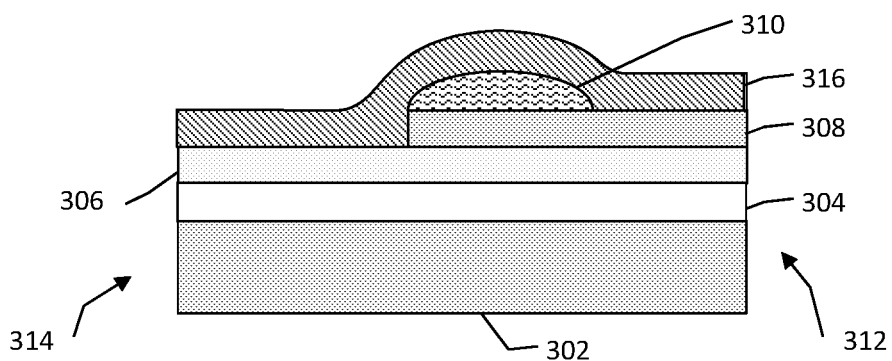

As illustrated in FIG. 5, another flexible material coating 316 is applied over the portion of the first flexible support layer 304 that is exposed, over the separator 310, and over the portion of the first conducting layer 308 that is exposed to form the second flexible support layer. Material of the separator 310 is selected to have a vapor pressure that is lower than the pressure that occurs during the deposition process of the flexible material. This enables the separator 310 to remain in a liquid state rather than evaporating while the second flexible support layer 316 is applied.

Figure 6:
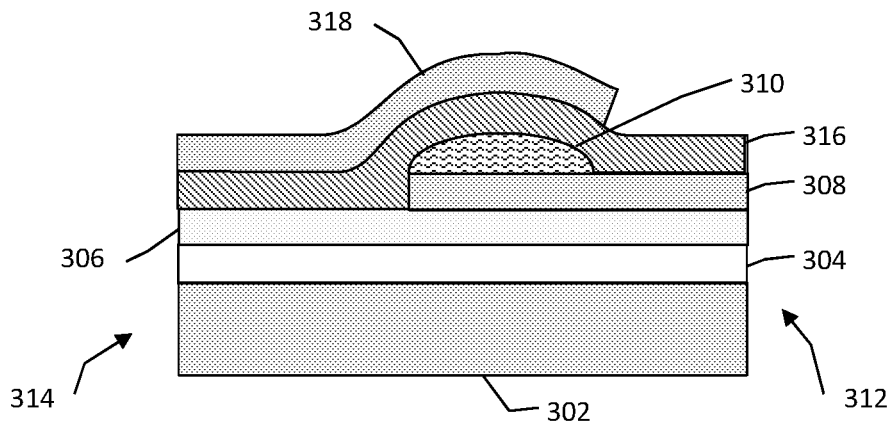

FIG. 6 illustrates a second conducting layer 318 applied over the second flexible support layer 316 extending from the first side 312 over less than an entirety of the second flexible support layer 316 such that at least a portion of the second conducting layer 318 overlaps the first conducting layer 308. The second conducting layer 318 can partially overlap the separator 310, fully overlap the separator 310, or extend beyond the separator 310. It is beneficial for the second conducting layer 318 to overlap with at least a portion of the first conducting layer 308 in order to form a parallel plate capacitor. However, it is also beneficial to limit a distance which the second conducting layer extends from the second side 314. Since the pressure sensor according to the disclosure detects a pressure by observing a change in capacitance of the parallel plate capacitor induced by relative motion between the two conducting layers, if the second conducting layer 318 extends farther, and is thus more resistant to motion, the pressure sensor may be less sensitive as a result. Therefore, the extent of the second conducting layer 318 should optimize for sensitivity of the pressure sensor and operability of the parallel plate capacitor.

In some embodiments, a wire connection or other type of connection configured to contact a contact region of an apparatus body mount is applied over the exposed portion of the second flexible support layer 316. The second conducting layer 318 and the first conducting layer 308 are respectively operable as electrodes of a parallel plate capacitor separated by the separator 310.

Figure 7:
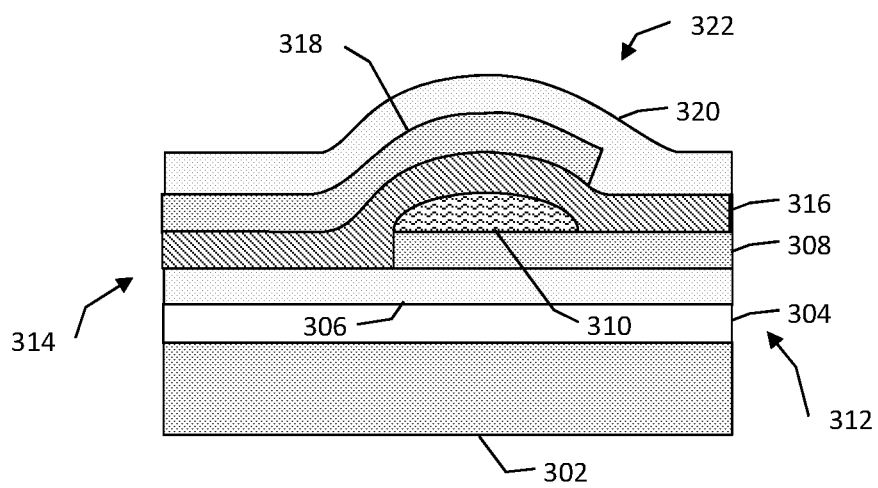

In FIG. 7, a third coating of flexible material 320 is applied over the second conducting layer 318 and the exposed portion of the second flexible support layer 308 in order to form a third flexible support layer, and thereby forming an intermediate structure 322 of a MEMS device.

Figure 8:
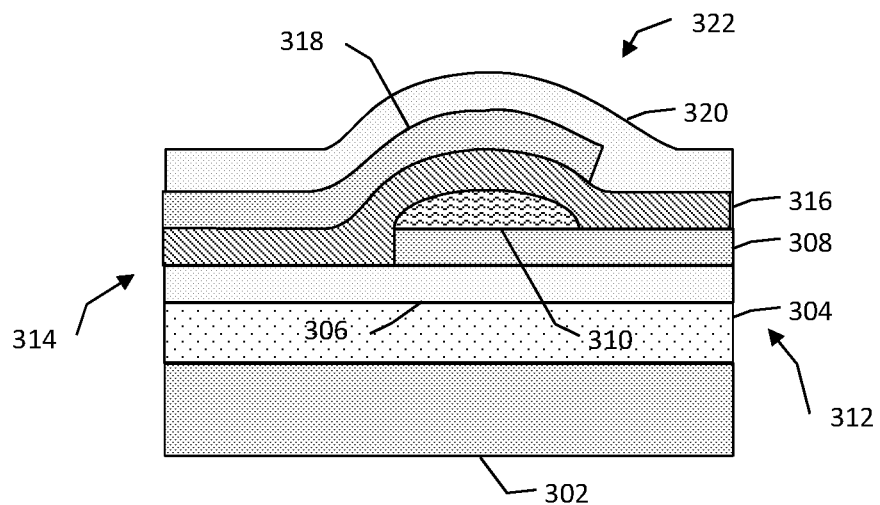

Releasing the assembled structure 322 in a process that does not damage the MEMS device and that is quick and easy to perform is beneficial. In one embodiment of a release process where the sacrificial layer 304 is a photoresist, the substrate 302 and the intermediate structure 322 are soaked in a water bath. Because the structure 322 is substantially encapsulated by the first and third flexible support layer 304, 320, the structure 322 can be soaked in the water bath without risking damage. In one embodiment, the water bath is a hot water bath having a temperature in a range from about 30 degrees C. to about 90 degrees C. As illustrated in FIG. 8, after soaking in the water bath, the photoresist sacrificial layer 304 expands due to the water, and as it expands, it releases from both the substrate 302 and first flexible support layer 306, thus releasing the structure 322.

In other embodiments, releasing the structure 322 from the substrate includes dissolving the sacrificial layer 302 via a solvent such as Acetone. However, some solvents may react with other substances in the structure in an undesired manner. For example, some solvents can cause Parylene to expand, which may damage the structure.

Figure 9:
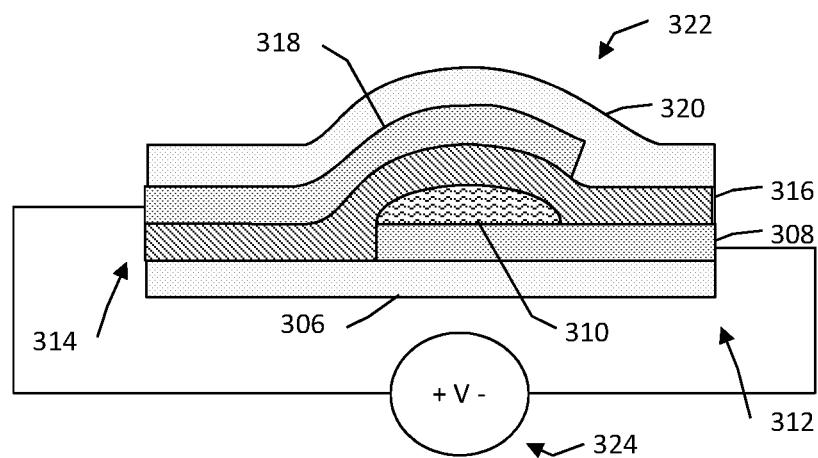

FIG. 9 illustrates a released structure 322 wherein the first conducting layer 308 is electrically connected to a negative terminal of a voltage source 324, and the second conducting layer 318 is electrically connected to a positive terminal of the voltage source 324. Ambient pressure around the structure 322 causes a compression or expansion of the structure 322, which results in a change in a relative position of the first and second conducting layers 308, 318. The change in relative position induces a change in capacitance of the parallel plate capacitor which can be determined, for example, by observing a corresponding change to a voltage or current at the voltage source 324.

While the above embodiments have been described with reference to MEMS pressure sensors, the reader should appreciate that the above-described MEMS device and production methods are not limited to pressure sensors. The technologies described above are suitable for other types of MEMS devices, for example accelerometers, gyroscopes, acoustic sensors, and optical sensors. In particular, the method of releasing a structure from a substrate by soaking the structure in a water bath in order to expand a sacrificial layer is applicable to a wide variety of MEMS devices, although it should be understood that such process may not be applicable to a MEMS device that may be damaged by water unless such device is substantially encapsulated, for example, by a Parylene coating.

In exemplary embodiments:

A flexible MEMS device includes a parallel plate capacitor formed by opposed conducting layers separated by silicone oil. One or more flexible Parylene layers are applied to surround one or more of the conducting layers and silicone oil. The parallel plate capacitor is configured to exhibit a change in capacitance corresponding to changes in ambient pressure. One or more of the conducting layers is configured to connect with an apparatus body mount that is configured to observe the capacitance of the parallel plate capacitor in order to determine the ambient pressure.

A method of releasing a MEMS device from a substrate includes applying a photoresist layer to the substrate, assembling a structure of the MEMS device on the photoresist layer, and soaking the structure, photoresist layer, and substrate in a water bath. When the photoresist bloats due to the water, the structure is released and detached from the substrate.

A pressure sensor is assembled from flexible materials to enable the pressure sensor to be fully flexible.

A method of producing a capacitive MEMS pressure sensor that includes: applying a sacrificial layer to a substrate; applying a first flexible support layer; applying a first conducting layer over less than an entirety of the first flexible support layer; applying a separator over an interior portion of the first conducting layer; applying a second flexible support layer over the first flexible support layer, the first conducting layer, and the separator; applying a second conducting layer over less than an entirety of the second flexible support layer to form a parallel plate capacitor in conjunction with the first conducting layer that is separated by the separator; applying a third flexible support layer over the second conducting layer and the flexible support layer to form a structure of a MEMS pressure sensor on the substrate; introducing the substrate and structure to a water bath; and releasing the structure from the substrate.

The method can further include mounting the released structure within a mount of an apparatus that includes a contact region configured to contact at least one of the first and second conducting region and at least one electrical component configured to power the MEMS pressure sensor, determine a pressure reading with reference to the MEMS pressure sensor, or transmit and receive electrical signals.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the foregoing disclosure.

What is claimed is:

1. A MEMS device comprising:
   a flexible MEMS sensor element formed by a plurality of layers, the plurality of layers including:
      a first flexible support layer; and
      a first conducting layer that extends from a first side of the MEMS sensor element and that is configured to operatively connect the MEMS sensor element to an apparatus;
      a second flexible support layer disposed over the first flexible support layer and the first conducting layer, such that the first conducting layer is encapsulated by the first flexible support layer and the second flexible support layer, the first conducting layer being disposed on the first flexible support layer, and extending over less than an entirety of the MEMS sensor element toward a second side opposite the first side;
      a second conducting layer disposed on the second flexible support layer and including a first end and a second end, the second conducting layer extending from the first end, located at the second side of the MEMS sensor element, over less than an entirety of the MEMS sensor element toward the first side, the second conducting layer at least partially overlaps the first conducting layer, the first and second conducting layers together forming a parallel plate capacitor; and
      a third flexible support layer disposed over the second conducting layer and the second flexible support layer such that the second conducting layer is encapsulated between the second flexible support layer and the third flexible support layer from the first end to the second end,
   wherein each layer of the MEMS sensor element includes flexible materials such that each layer of the MEMS sensor element is flexible.

2. The MEMS device of claim 1, the MEMS sensor element being a MEMS pressure sensor.

3. The MEMS device of claim 1, the MEMS sensor element further including:
   a separator encapsulated between the first conducting layer and the second flexible support layer, and configured to space apart the first conductor layer from the second conductor layer.

4. The MEMS device of claim 3, wherein:
   the separator is one of a liquid or a gel; and
   the separator has a lower vaper pressure than a deposition pressure of the second flexible support layer.

5. The MEMS device of claim 4, wherein:
the second flexible support layer includes a Parylene; and
the separator includes a silicone oil.

6. The MEMS device of claim 3, the MEMS sensor element further including at least one of:
- a connecting element that extends from the first conducting layer to the second side of the MEMS sensor element; and
- a connecting element that extends from the second conducting layer to the first side of the MEMS sensor element.

7. The MEMS device of claim 1, further comprising:
at least one apparatus body mount that includes:
- at least one electrical component that is configured to removably receive the MEMS sensor element, and that is configured to electrically connect to the MEMS sensor element when the MEMS sensor element is received in the at least one apparatus body mount,
wherein the at least one apparatus body mount is configured to removably receive the MEMS sensor element in such a way that the at least one apparatus body is reusable upon removal of the MEMS sensor element.

8. The MEMS device of claim 7, the at least one apparatus body mount further including:
a pair of mounting members configured to receive the MEMS sensor element therebetween with an interference fit,
wherein at least one of the mounting members is a spring member that is pivotably mounted on the at least one apparatus body mount, and that is configured to clip the MEMS sensor element into the at least one apparatus body mount along with an opposite mounting member.

9. The MEMS device of claim 1, wherein third flexible support layer extends from the first side to the second side so as to cover the second conducting layer and a portion of the second flexible support layer not in contact with the second conducting layer such that the first conducting layer, the second flexible support layer, and the second conducting layer are between and encapsulated by the first flexible support layer and the third flexible support layer.

10. A method of producing a MEMS device, comprising:
disposing a layer of photoresist on a substrate;
forming a MEMS sensor element over the layer of photoresist to form an intermediate structure, wherein the MEMS sensor element is at least one of:
encapsulated by material that is insoluble to water; and
configured so as to be unreactive to water; and
soaking the intermediate structure in a water bath having a temperature from about 30 degrees C. to about 90 degrees C. until the MEMS sensor element is released from the layer of photoresist.

11. A method of producing a flexible MEMS pressure sensor, comprising:
forming a sacrificial layer on a substrate;
forming a first flexible support layer on the substrate;
forming a first conducting layer on the first flexible layer that extends from a first side over less than an entirety of the first flexible support layer;
forming a liquid or gel separator on an internal region of the first conducting layer;
forming a second flexible support layer via vapor deposition on the first flexible support layer, on the separator, and on the first conducting layer, extending from the first side to a second side opposite the first side, so as to encapsulate the separator between the first conducting layer and the second flexible support layer, and so as to encapsulate the first conducting layer between the first flexible support layer and the second flexible support layer and separator, wherein the separator has a lower vapor pressure than a vapor pressure that occurs during the vapor deposition of the second flexible support layer;
forming a second conducting layer on the second flexible support layer, the second conducting layer having a first end and a second end, the second conducting layer extending from the first end, located at the second side, over less than an entirety of the second flexible support layer, such that the second conducting layer at least partially overlaps the first conductive layer to form a parallel plate capacitor; and
forming a third flexible support layer over the second conducting layer and the second flexible support layer so as to encapsulate the second conducting layer between the second flexible support layer and the third flexible support layer from the first end to the second end.

12. The method of claim 11, further comprising:
soaking the MEMS pressure sensor in a water bath having a temperature of about 30 degrees C. to about 90 degrees C. until the MEMS pressure sensor is released from the sacrificial layer.

13. The method of claim 11, wherein third flexible support layer extends from the first side to the second side so as to cover the second conducting layer and a portion of the second flexible support layer not in contact with the second conducting layer such that the first conducting layer, the second flexible support layer, and the second conducting layer are between and encapsulated by the first flexible support layer and the third flexible support layer.

* * * * *

UNITED STATES PATENT AND TRADEMARK OFFICE
CERTIFICATE OF CORRECTION

PATENT NO. : 10,479,677 B2
APPLICATION NO. : 15/535327
DATED : November 19, 2019
INVENTOR(S) : Yee et al.

Page 1 of 1

It is certified that error appears in the above-identified patent and that said Letters Patent is hereby corrected as shown below:

In the Claims

At Column 11, Line 4, in Claim 6: "The MEMS device of claim 3," should read --The MEMS device of claim 1,--

Signed and Sealed this
Twenty-eighth Day of April, 2020

Andrei Iancu
*Director of the United States Patent and Trademark Office*